(12) United States Patent
Wang et al.

(10) Patent No.: US 8,475,210 B2
(45) Date of Patent: *Jul. 2, 2013

(54) ELECTRICAL CONNECTOR ASSEMBLY WITH HIGH SIGNAL DENSITY

(75) Inventors: Chien-Chiung Wang, New Taipei (TW); Xue-Liang Zhang, Kunshan (CN); Qing-Man Zhu, Kunshan (CN)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 0 days.

This patent is subject to a terminal disclaimer.

(21) Appl. No.: 13/210,605

(22) Filed: Aug. 16, 2011

(65) Prior Publication Data

US 2012/0040560 A1    Feb. 16, 2012

(51) Int. Cl.
*H01R 13/648* (2006.01)

(52) U.S. Cl.
USPC .................................... 439/607.31

(58) Field of Classification Search
USPC .................. 439/607.31, 352, 676, 55, 59, 60, 439/62, 67
See application file for complete search history.

(56) References Cited

U.S. PATENT DOCUMENTS

| | | | |
|---|---|---|---|
| 5,425,651 A | 6/1995 | Thrush et al. | |
| 5,580,527 A | 12/1996 | Bell et al. | |
| 6,142,802 A | 11/2000 | Berg et al. | |
| 6,368,129 B1 | 4/2002 | Wang et al. | |
| 6,517,382 B2 | 2/2003 | Flickinger et al. | |
| 6,524,134 B2 | 2/2003 | Flickinger et al. | |
| 6,744,963 B2 * | 6/2004 | Hwang | 385/139 |
| 7,008,253 B2 * | 3/2006 | Szczesny | 439/352 |
| 7,160,135 B1 * | 1/2007 | Wu | 439/352 |
| 7,736,171 B2 * | 6/2010 | Reed et al. | 439/352 |
| 7,771,225 B1 * | 8/2010 | Wu | 439/352 |
| 7,798,820 B2 | 9/2010 | Hong | |
| 7,841,887 B2 * | 11/2010 | Zhang et al. | 439/352 |
| 7,892,033 B2 * | 2/2011 | Huang et al. | 439/626 |
| 8,064,207 B2 * | 11/2011 | Wu | 361/747 |
| 2009/0227133 A1 * | 9/2009 | Zhang et al. | 439/160 |
| 2009/0274468 A1 * | 11/2009 | Zhang et al. | 398/139 |
| 2010/0330841 A1 * | 12/2010 | Zhang et al. | 439/607.41 |
| 2011/0034082 A1 * | 2/2011 | Zhu et al. | 439/607.41 |
| 2012/0040569 A1 * | 2/2012 | Wang et al. | 439/676 |

OTHER PUBLICATIONS

SFF Committee, SFF-8342 Specification for Improved Pluggable Formfactor, Rev 5.0, Jul. 16, 2007.
SFF Committee, SFF-8341 Specifications for Enhanced 8.5 and 10 Gigabit Small Form Factor Pluggable Module "SFP+", Revision 2.1, Aug. 30, 2007, pp. 3-5.

* cited by examiner

*Primary Examiner* — Briggitte R Hammond
*Assistant Examiner* — Vladimir Imas
(74) *Attorney, Agent, or Firm* — Ming Chieh Chang; Wei Te Chung

(57) ABSTRACT

An electrical connector comprises a PCB (220) having a front edge to be inserted into a mating receptacle. The PCB comprises a top face having a row of first mating pads (242), and an opposite bottom face having a row of second mating pads (262) and a row of third mating pads (264) behind the second row of mating pads. The first and second mating pads are compatibly fit with an SFP receptacle (120). The PCB comprises a first sub-PCB (540) having a first outer layer containing the first mating pads and an opposite second outer layer containing the second mating pads, and a second sub-PCB (560) attached to the second outer layer on an area behind the second mating pads, the second sub-PCB having a second outer layer containing the third mating pads.

20 Claims, 15 Drawing Sheets

ELECTRICAL CONNECTOR ASSEMBLY WITH HIGH SIGNAL DENSITY

BACKGROUND OF THE INVENTION

1. Field of the invention

The present invention relates to an electrical connector assembly, and particularly, to an electrical connector assembly with high signal data rates. This application relates to a copending application having the same title, the same inventors, the same assignee and the same filing date with the invention.

2. Description of Related Art

Small form-factor pluggable (SFP) or Mini-GBIC is a compact, hot-pluggable transceiver used for both telecommunication and data communications applications. It interfaces a network device mother board (for a switch, router, media converter or similar device) to a fiber optic or copper networking cable. It is a popular industry format supported by many network component vendors. SFP transceivers are designed to support SONET, Gigabit Ethernet, Fibre Channel, and other communications standards.

SFP transceivers are also available with a copper cable interface, allowing a host device designed primarily for optical fiber communications to also communicate over unshielded twisted pair networking cable or transport SDI video signal over coaxial cable. There are also CWDM and single-fiber "bi-directional" (1310/1490 nm Upstream/Downstream) SFPs. SFP transceivers are commercially available with capability for data rates up to 4.25 Gbit/s. An enhanced standard called SFP+(defined in SFF-8341 and SFF-8342) supports data rates up to 10.0 Gbit/s. SFP related technologies are also disclosed in U.S. Pat. No. 6,524,134, issued to Flickinger on Feb. 25, 2003, and U.S. Pat. No. 6,517,382, issued to Flickinger on Feb. 11, 2003.

The SFP+ module comprises a host board (printed circuit board) having a row of first mating pads on a top face and a row of second mating pads on a bottom face (referring to page 5 of SFF-8431), the first mating pads and the second mating pads adapted to electrically contact terminals of a receptacle. Multi-layer PCB is commonly known to be made of at least two sub-PCBs stacked together, each sub-PCB having an insulating layer and two conductive layer attached to opposite sides of the insulating layer.

U.S. Pat. No. 7,798,820, issued to Hong on Sep. 21, 2010, discloses an improvement on SFP. One embodiment shows a PCB 50 having one row of contact pads on a bottom surface and two rows of contact pads on a top surface. Another embodiment shows a PCB 60 having two rows of contact pads on a top surface 60B and two rows of contact pads on a bottom surface 60A. It is further contemplated that contact pad configurations can be included on one or both surfaces of the PCB or edge connector. In the design where a PCB has two rows of contact pads on a top surface, it results that the host receptacle then has two rows of contact pins above a receiving slot of the host receptacle. The two rows of contacts pins increase a height of the host receptacle 212 compared to an existing SFP receptacle. At the same time, the two rows of contacts pins are difficult to handle during manufacturing the host receptacle.

Low profile, low cost of manufacturing, higher mating compatibility are trends of the electrical connector and the present invention is towards this purpose.

SUMMARY OF THE INVENTION

An object of the present invention is to provide an electrical connector with higher signal density. The electrical connector comprises an insulating housing defining a horizontal slot extending along a lateral direction perpendicular to a front-to-rear direction, a row of first mating contacts arranged along an upper side of the horizontal slot, a row of second mating contacts arranged along a lower side of the horizontal slot, and a row of third mating contacts arranged along the lower side of the horizontal slot and in front of the row of the second mating contacts. The insulating housing forms a front step on the lower side relative to the upper side of the horizontal slot for receiving a part of the third mating contacts.

Still another object of the present invention is to provide another electrical connector with higher signal density. The electrical plug comprises a shielding shell defining a cavity therein, and a PCB received in the cavity. The PCB defines a top face and a bottom face and has a front edge to be inserted into a receptacle. The front edge comprises a front narrower portion and a rear broader portion. The front narrower portion has a row of first mating pads on the top face and a row of second mating pads on the bottom face. The rear broader portion has a row of third mating pads on the bottom face.

Other objects, advantages and novel features of the invention will become more apparent from the following detailed description of a preferred embodiment when taken in conjunction with the accompanying drawings.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF THE INVENTION

Figure 1:
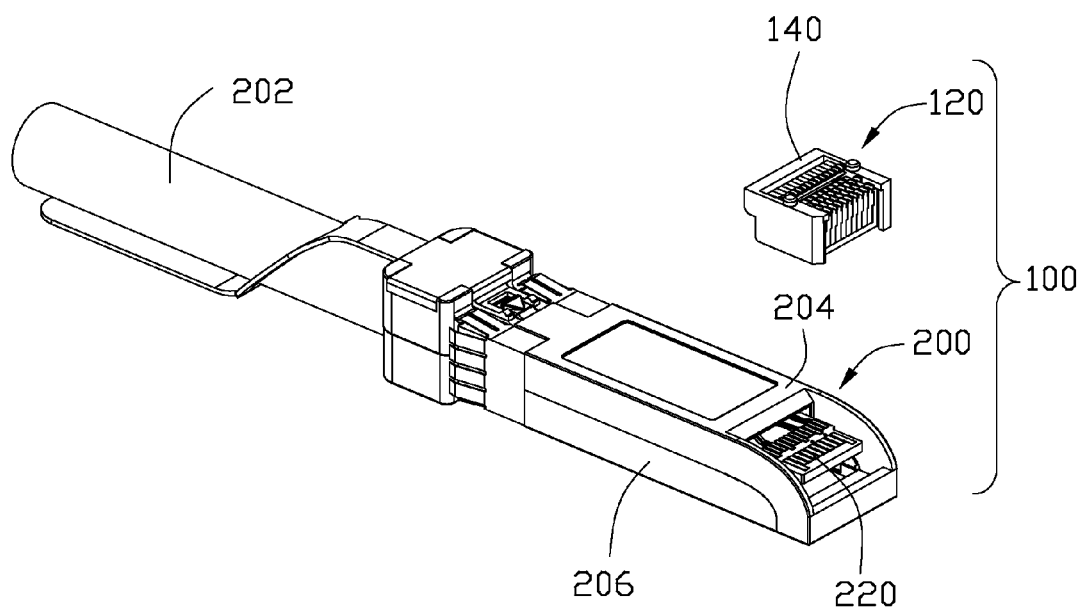
FIG. 1 is a perspective view of an electrical connector assembly according to a first embodiment of the present invention.

Reference will now be made to the drawing figures to describe the present invention in detail.

Referring to FIGS. 1-9, an electrical connector assembly 100 according to a first embodiment of the present invention is shown. The electrical connector assembly 100 includes an electrical plug 200 and a mating electrical receptacle 120 mounted onto a host board (not shown). When the electrical connector assembly 100 is used in a real environment, a shielding cage is mounted onto the host board before the electrical receptacle 120 and form a passageway receiving the electrical plug 200. In order to clearer show the structure of the electrical connector assembly 100, the cage is removed in the figures.

Figure 2:
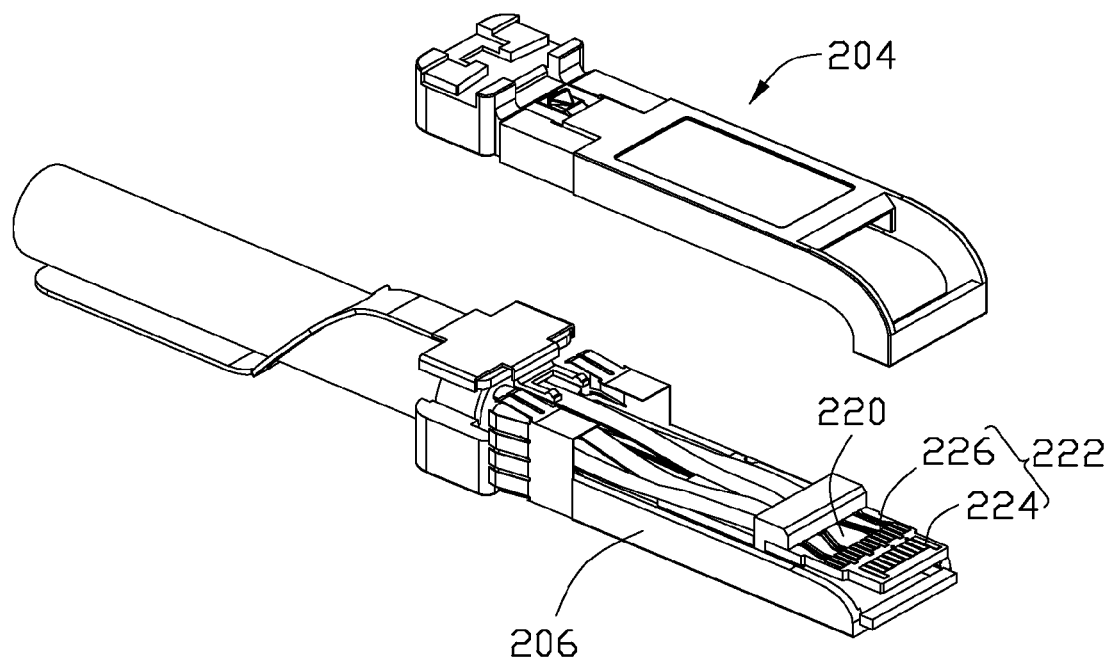
FIG. 2 is a partly exploded view of an electrical plug of the electrical connector assembly shown in FIG. 1.
Figure 3:
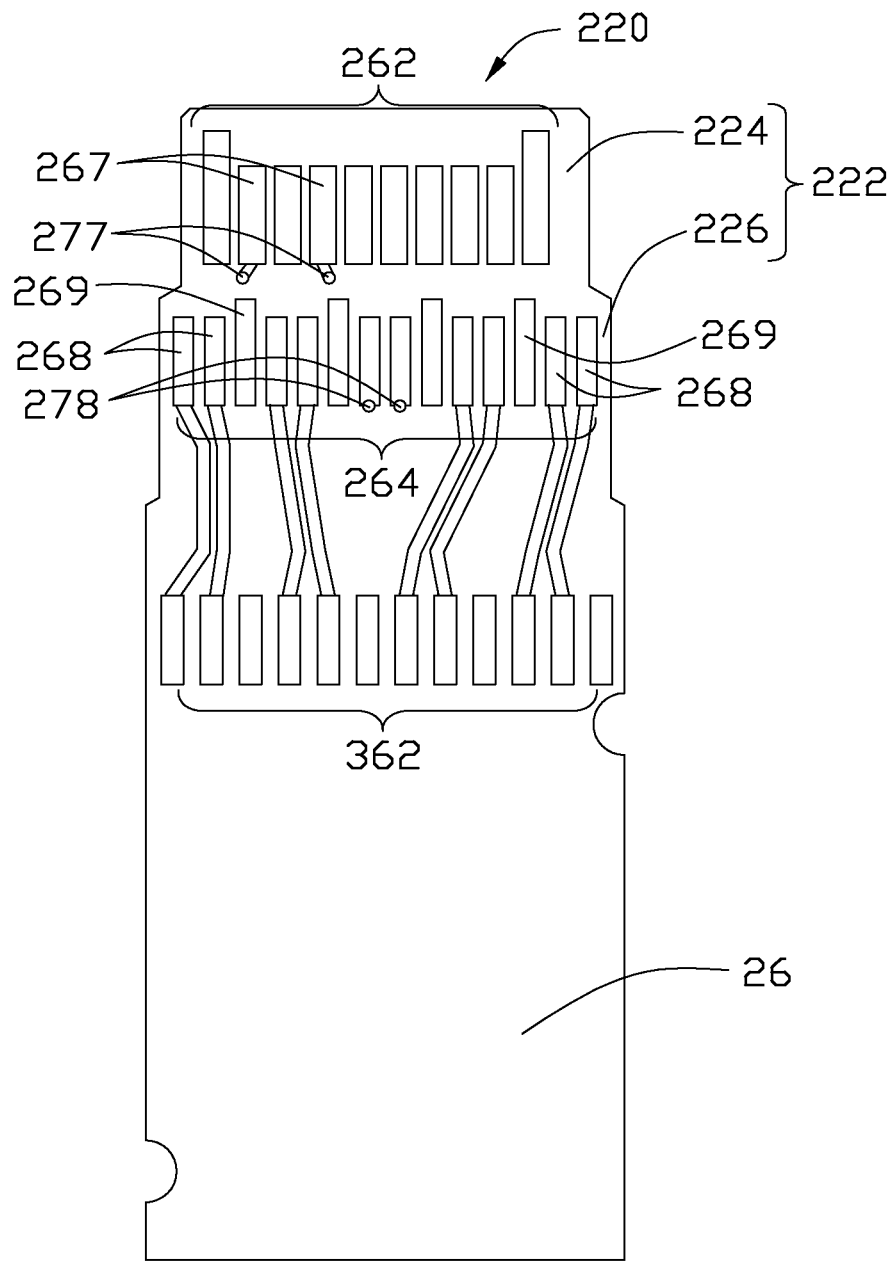
FIG. 3 is a top view of a PCB of the electrical plug shown in FIG. 2.
Figure 4:
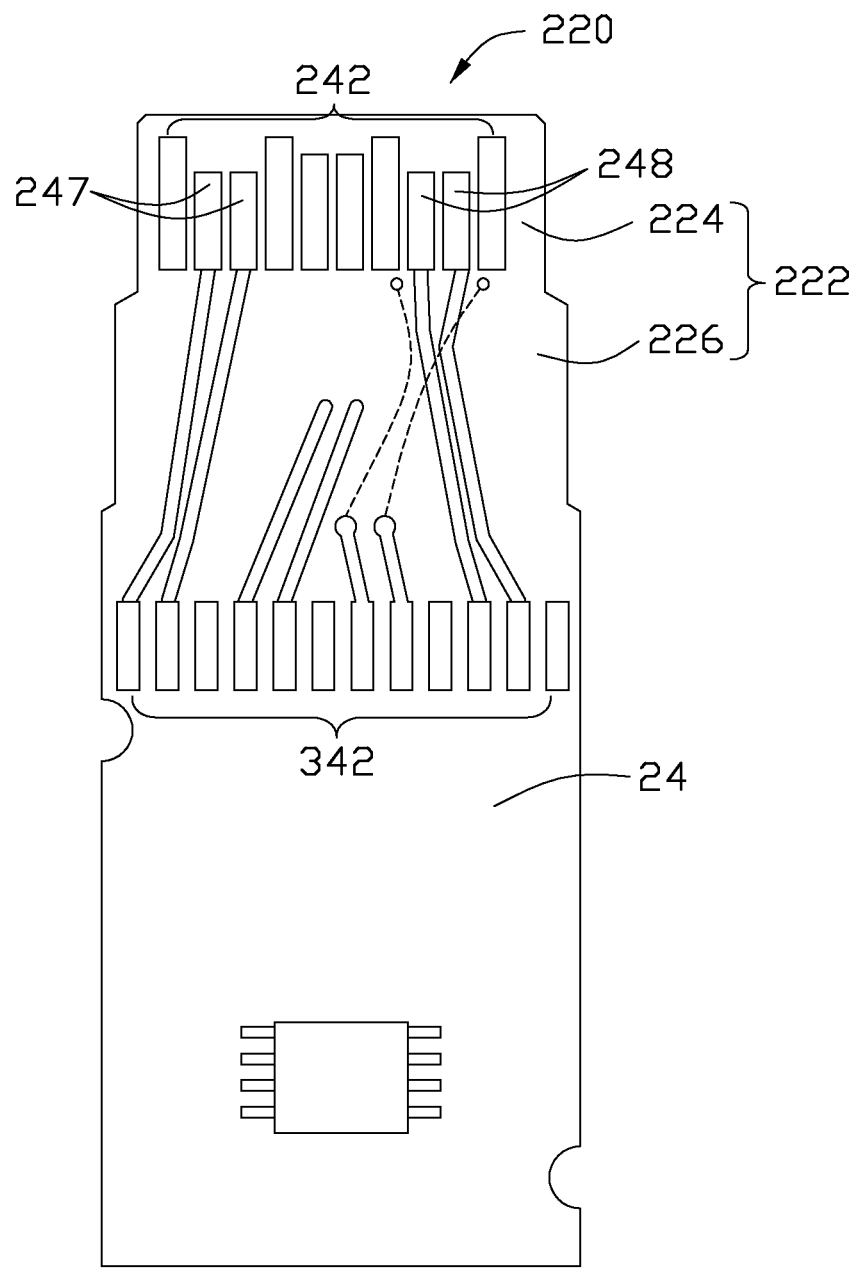
FIG. 4 is bottom view of the PCB shown in FIG. 3.
Figure 5:
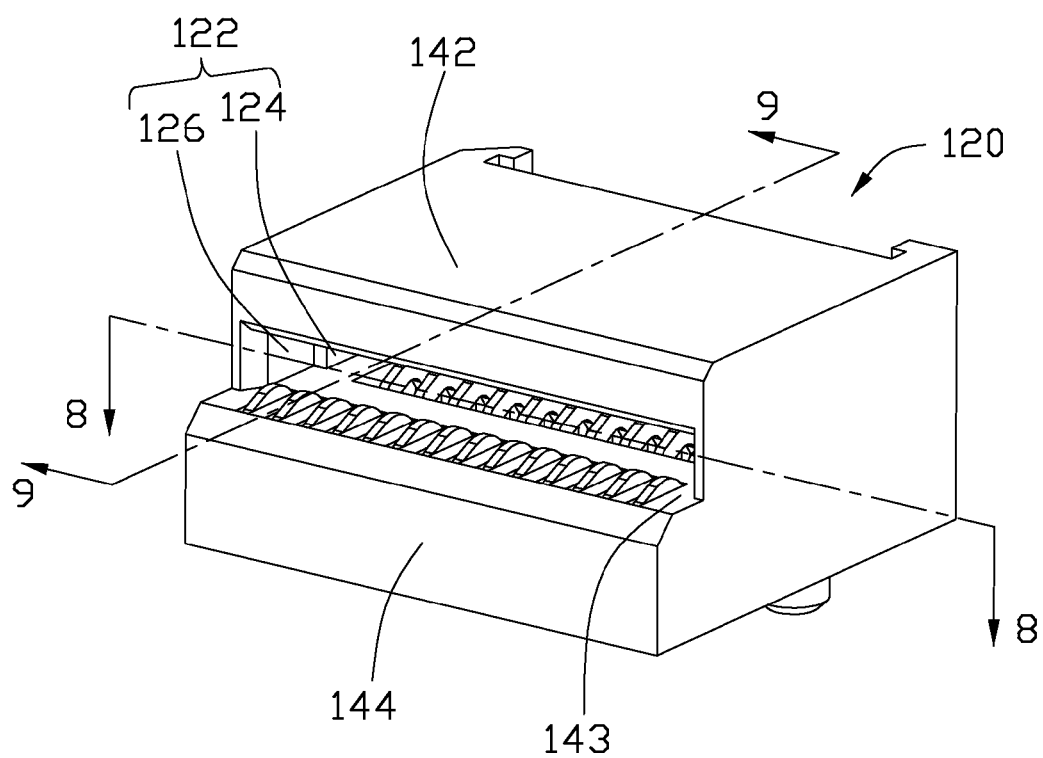
FIG. 5 is a perspective view of an electrical receptacle of the electrical connector assembly shown in FIG. 1.
Figure 6:
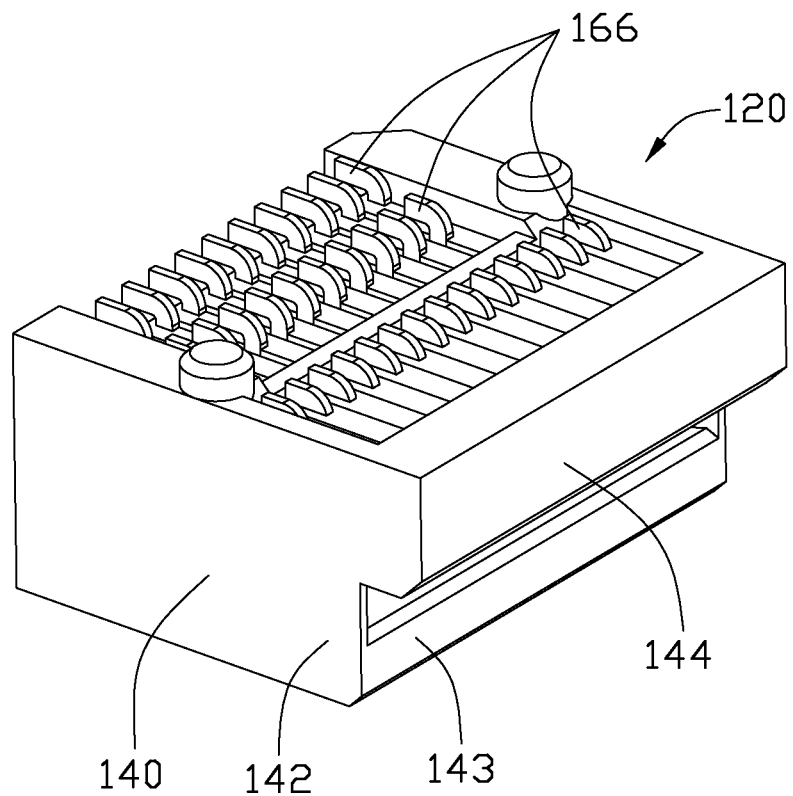
FIG. 6 is another perspective view of the electrical receptacle shown in FIG. 5

Referring to FIGS. 2-4, the electrical plug 200 comprises a top metal cover 204 and a bottom metal cover 206 combined to define a cavity (not labeled) and a PCB 220 received in the cavity. The PCB 220 has a front edge 222 to be inserted into the electrical receptacle 120 and a rear edge (not labeled) connected to an end of a cable 202. The top metal cover 204 and the bottom metal cover 206 shields the PCB 220 and the end of the cable.

The PCB 220 defines a top face 24 and an opposite bottom face 26. The top face 24 has a row of first mating pads 242 on the front edge 222 and a row of first terminating pads 342 on the rear edge. The bottom face 26 has a row of second mating pads 262 aligned to the row of first mating pads 242 in a direction perpendicular to the PCB 220, a row of third mating pads 264 behind the second row of mating pads 262, and a row of second terminating pads 362 on the rear edge.

The three rows of mating pads 242, 262, 264 electrically connect the mating electrical receptacle 120 when the front edge 222 of the PCB 220 is inserted into the mating receptacle 120. The first mating pads 242 and the second mating pads 262 are compatibly fit for an existing SFP receptacle. The first terminating pads 342 and the second terminating pads 362 are electrically connected to the cable (not shown). Furthermore, the electrical plug 200 meets the specification of SFP+ defined in SFF-8431 and SFF-8432 and therefore can insert into an existing SFP+ receptacle. Accordingly, the number of the first mating pads 242 is ten, among which two pairs 247, 248 are each used for transferring differential signals; the number of the second mating pads 262 is also ten. In order to improve signal density, the seventh and ninth mating pads 267 of the second mating pads, which are spare in SFF-8431, are now defined as a pair in the present electrical plug 200 for transferring differential signals, and the row of third mating pads 264 is added as for transferring signal differential pair. The row of third mating pads 264 is arranged with five signal pairs 268 alternated with grounding pads 269. Each of the third mating pads 264 is designed to make electrical contact when the electrical plug 200 is inserted into the electrical receptacle 120.

The front edge 222 comprises a front narrower portion 224 and a rear broader portion 226. The first mating pads 242 and the second mating pads 262 are disposed on opposite faces of the front narrower portion 224. The third mating pads 264 are disposed on the bottom face 26 of the rear broader portion 226. The number of the third mating pads 264 is greater than the number of the second mating pads 262. The front narrower portion 224 is fit for an existing SFP receptacle and the rear broader portion 226 acts as a block preventing the electrical plug 200 from being further inserted into the existing SFP receptacle.

The first terminating pads 342 are arranged in four pairs, alternating with grounding ones, for transferring signal differential pairs. The second terminating pads 362 are arranged in the same manner as the first terminating pads.

Figure 10:
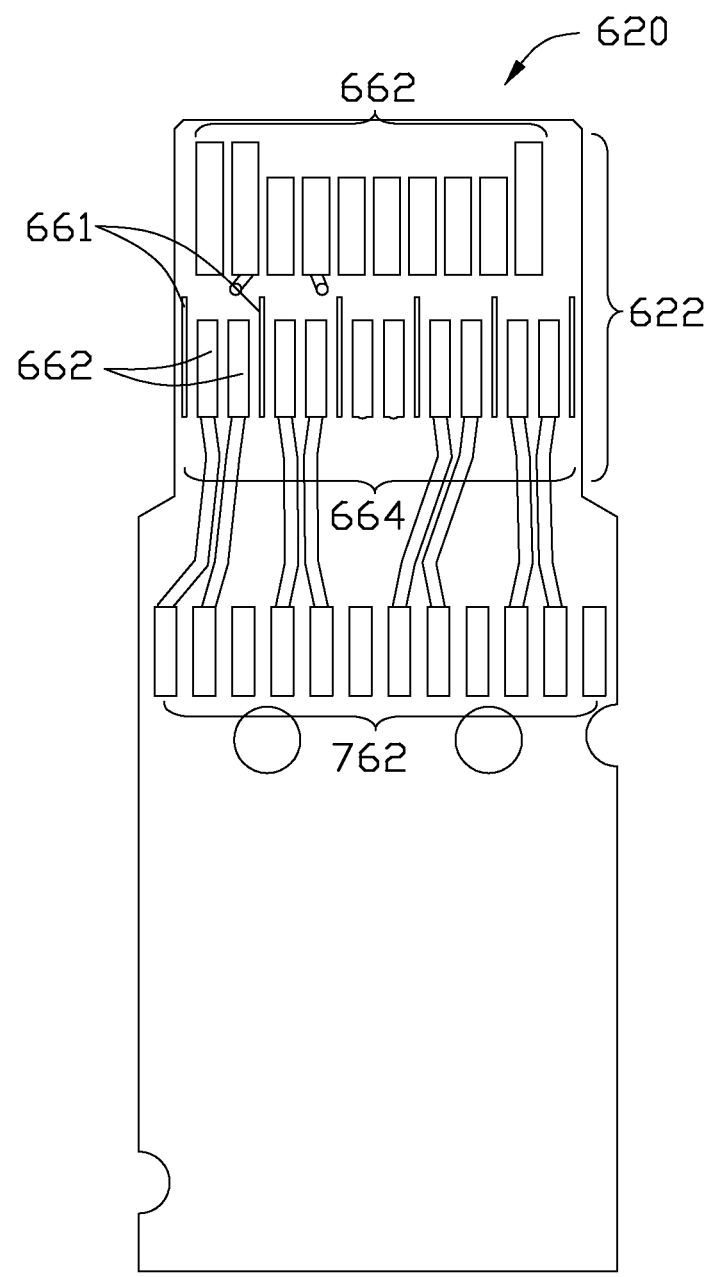
FIG. 10 is a top view of a PCB of an electrical plug according to a second embodiment of the present invention.
Figure 11:
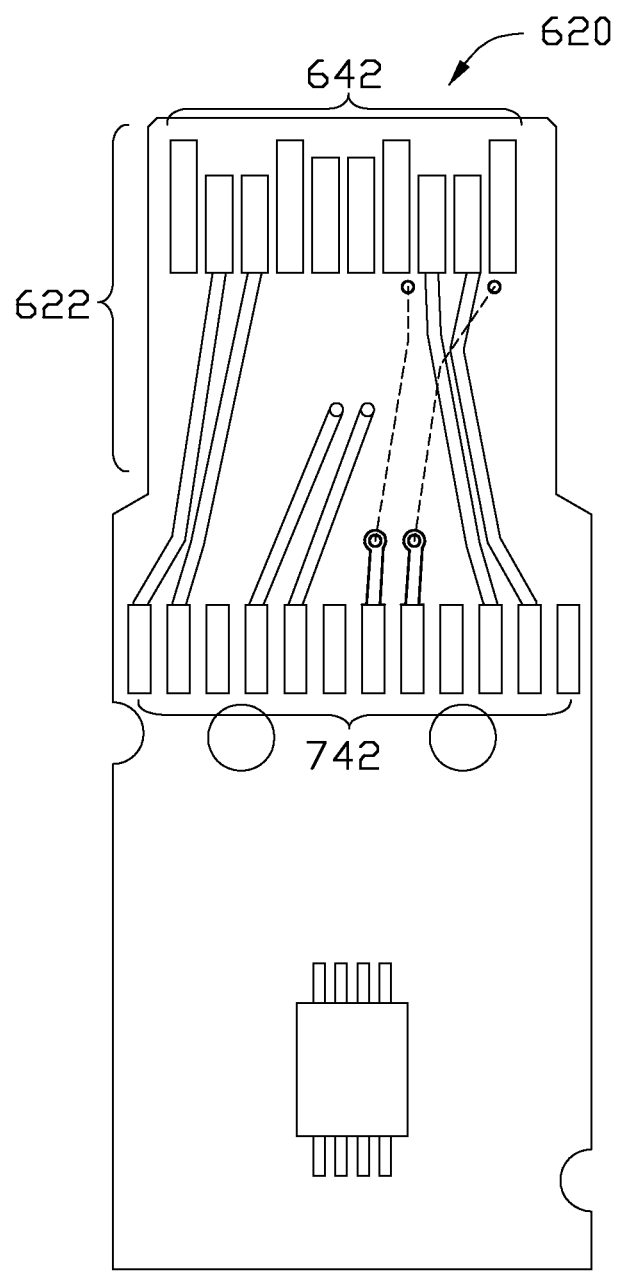
FIG. 11 is a bottom view of the PCB shown in FIG. 10.
Figure 12:
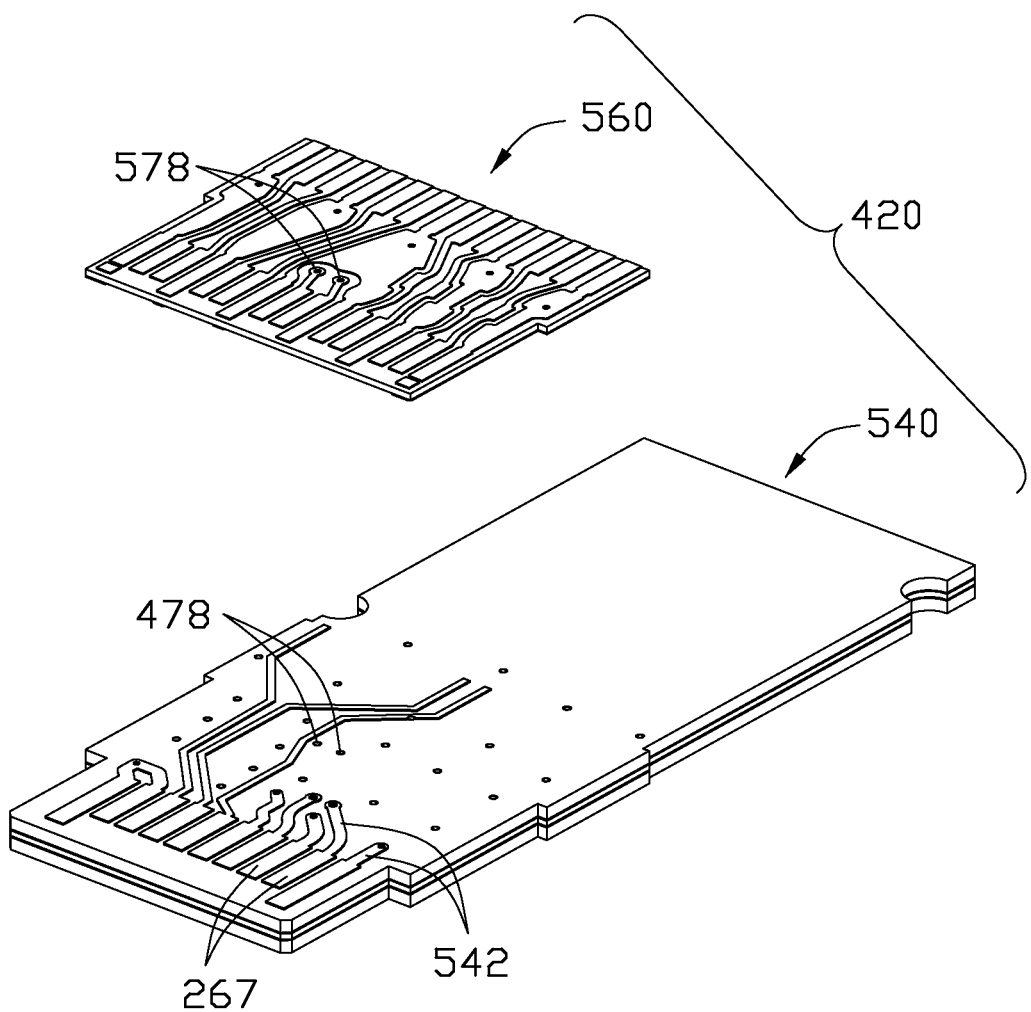
FIG. 12 is a perspective view of a PCB of an electrical plug according to a third embodiment of the present invention.
Figure 13:
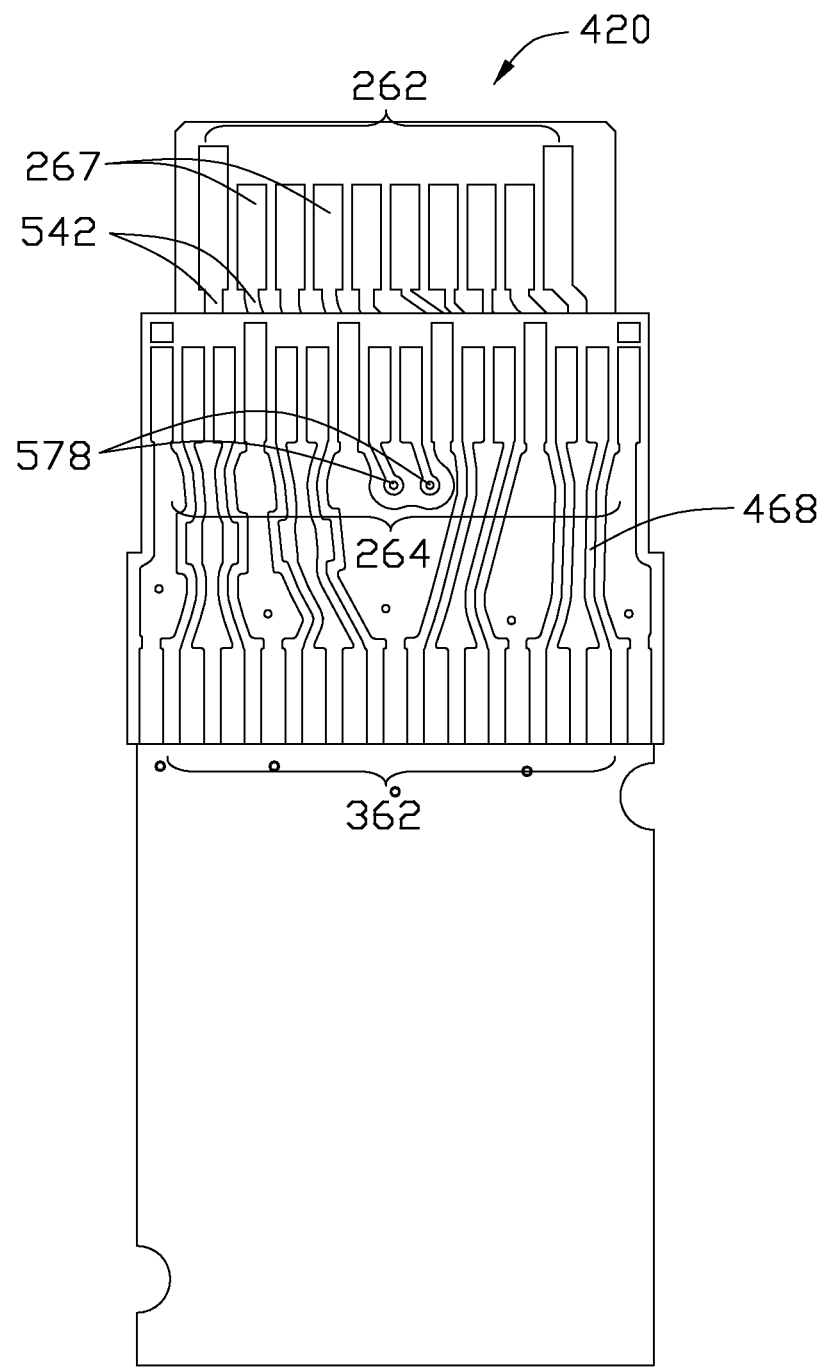
FIG. 13 is a top view of the PCB shown in FIG. 12.
Figure 14:
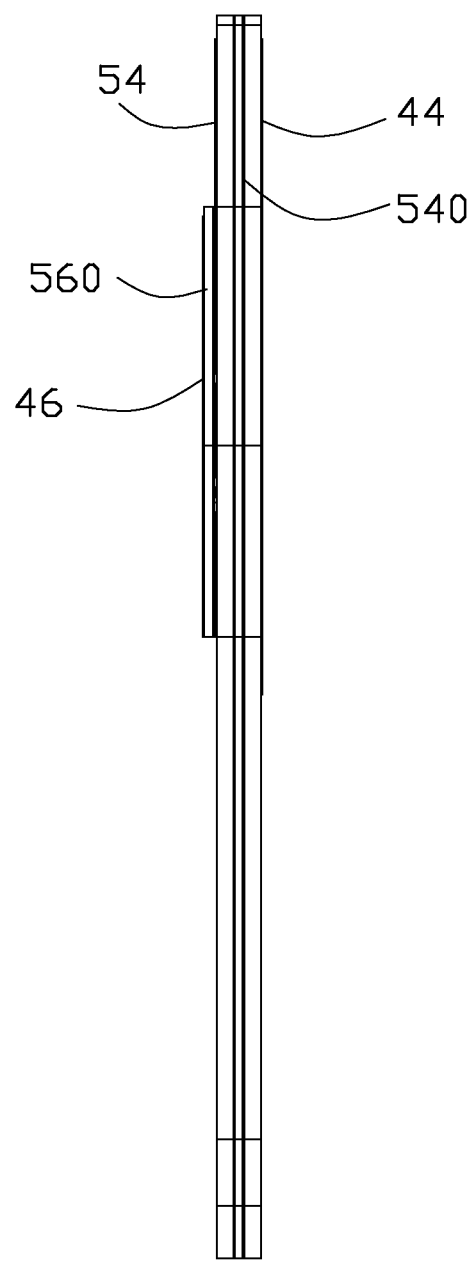
FIG. 14 is a bottom view of the PCB shown in FIG. 12.
Figure 15:
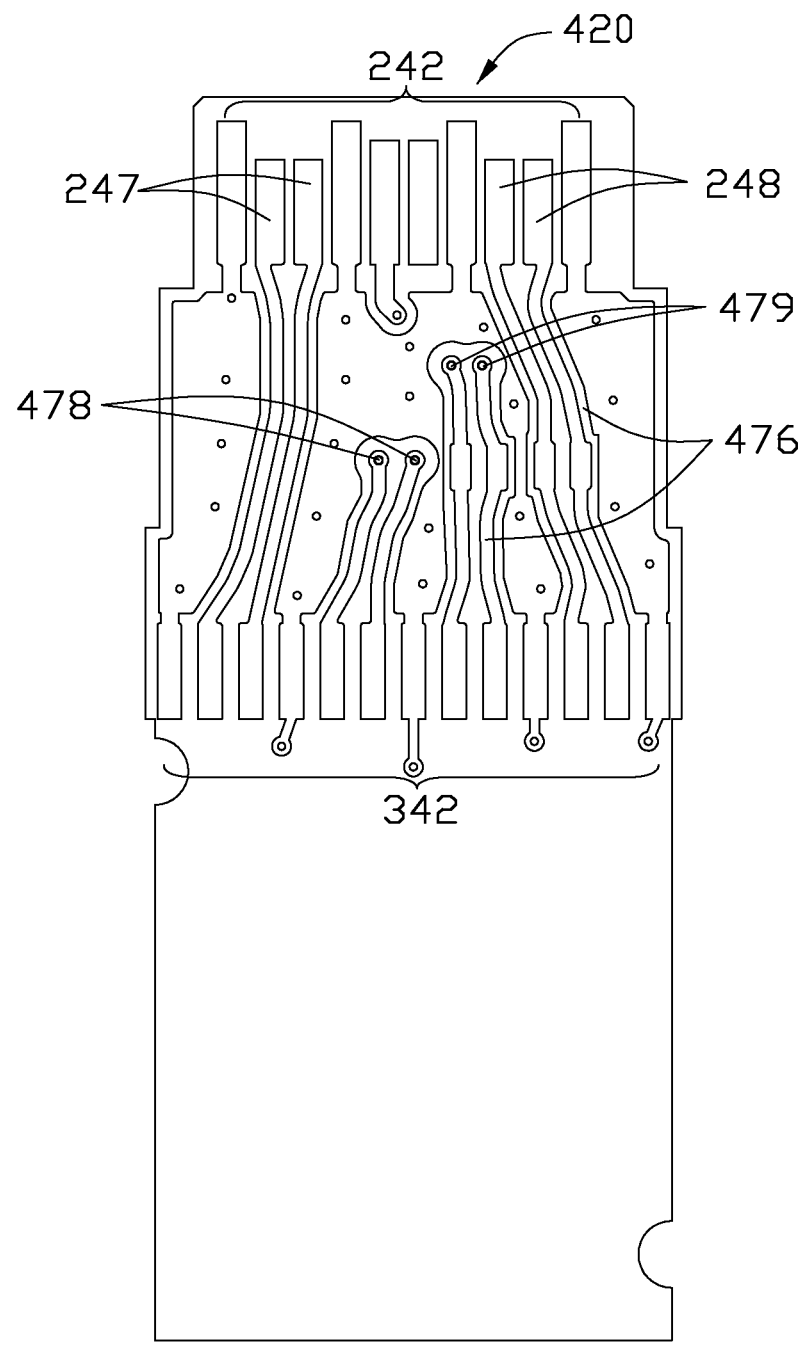
FIG. 15 is an exploded view of the PCB shown in FIG. 12.

Referring to FIGS. 10-11, a PCB 620 to be used in an electrical plug (not shown) according to a second embodiment of the present invention is shown. The PCB 620 has similar conductive pads, such as a row of first mating pads 642, a row of second mating pads 662, a row of third mating pads 664, a first row of terminating pads 742, a second terminating pads 762. The PCB 620 has a front edge 622 having a length to be inserted into the electrical receptacle 120 and the front edge has a same width along a mating length. The third row of mating pads 662 is arranged with five signal pairs 662 and each signal pair is sandwiched two shielding traces. Each of the shielding traces is quite slim and makes no electrical contact when the electrical plug is inserted into the electrical receptacle 120.

Referring to FIGS. 12-15, a PCB 420 to be used in an electrical plug (not shown) according to a third embodiment of the present invention is shown. The PCB 420 is designed with the same mating pads 242, 262, 264 and terminating pads 342, 362 except that the PCB 420 is made of a four-layer first sub-PCB 540 and a two-layer second sub-PCB 560. The first sub-PCB 540 has a first outer layer 44 and an opposite second outer layer 54. The first outer layer 44 forms the first mating pads 242, the first terminating pads 342 and a plurality of first circuit traces 476 connecting the first mating pads 242 and the first terminating pads 342. The second outer layer 54 forms the second mating pads 262 and a plurality of circuit traces 542 connecting the second mating pads 262. The second sub-PCB 560 has a first outer layer (not labeled) attached to the first sub-PCB 540 on an area behind the second mating pads 262 and an opposite second outer layer 46 forming the third mating pads 264, the second terminating pads 362, and a plurality of second circuit traces 468 connecting the third mating pads 264 and the second terminating pads 362. Additionally, the first sub-PCB 540 forms two pairs of conductive holes 478, 479, among which one pair 479 is connected between the signal pair 267 of the second mating pads 262 and one signal pair of the first terminating pads 342, and the other pair 478 is connected between one signal pair of the third mating pads 264 and one signal pair of the first terminating pads 342. The second sub-PCB 560 forms a pair of conductive holes 578 which is connected with said other pair of conductive holes 478 of the first sub-PCB 540 and one associated pair of the third mating pads 264.

It should be noted that some of the first and second circuit traces 468, 476 are broken where electronic components (not shown) are provided to bridge the broken portions.

Referring back to FIGS. 5-8, the electrical receptacle 120 is used to be mounted onto a mother board (not shown). The electrical receptacle 120 comprises an insulating housing 140 defining a horizontal slot 122, a row of first mating contacts 162 arranged along an upper side 142 of the horizontal slot 122, a row of second mating contacts 164 arranged along a lower side 144 of the horizontal slot 122, and a row of third mating contacts 168 arranged along the lower side 144 of the horizontal slot 122 and in front of the row of the second mating contacts 164. The horizontal slot 122 extends along a lateral direction perpendicular to a front-to-rear direction for receiving the front edge 222 of the PCB 220. The insulating housing 140 forms a front step 144 on the lower side 144 relative to the upper side 142 of the horizontal slot 122 for receiving a part of the third mating contacts 168.

It should be understood that the electrical receptacle 120 the row of third mating contacts 168 are also arranged alternatively in pairs adapted for differential signals and singles adapted for grounding according to the arrangement of the third mating pads 264 of the PCB 220. There are five pairs of third mating contacts 168 and four singles of third mating contacts 168, which could be seen in FIGS. 3, 7 and 8.

Each of the first mating contacts 162 is offset a distance relative to a corresponding second mating contacts 164 in the lateral direction. Each of the first mating contacts 162 and corresponding the second mating contacts 164 are insert-molded into a first insulative material 172 to form a first wafer. The first wafers are first stacked together and then inserted into the housing 140 as a whole. Each of the third mating contacts 168 is insert-molded into a second insulative material 178 to form a second wafer. The second wafers are first stacked together and then inserted into the housing 140 as a whole, too. Each of the first mating contacts 162, the second mating contacts 164 and the third mating contacts 168 has a soldering portion 166 to be surface mounted onto the mother board.

Figure 7:
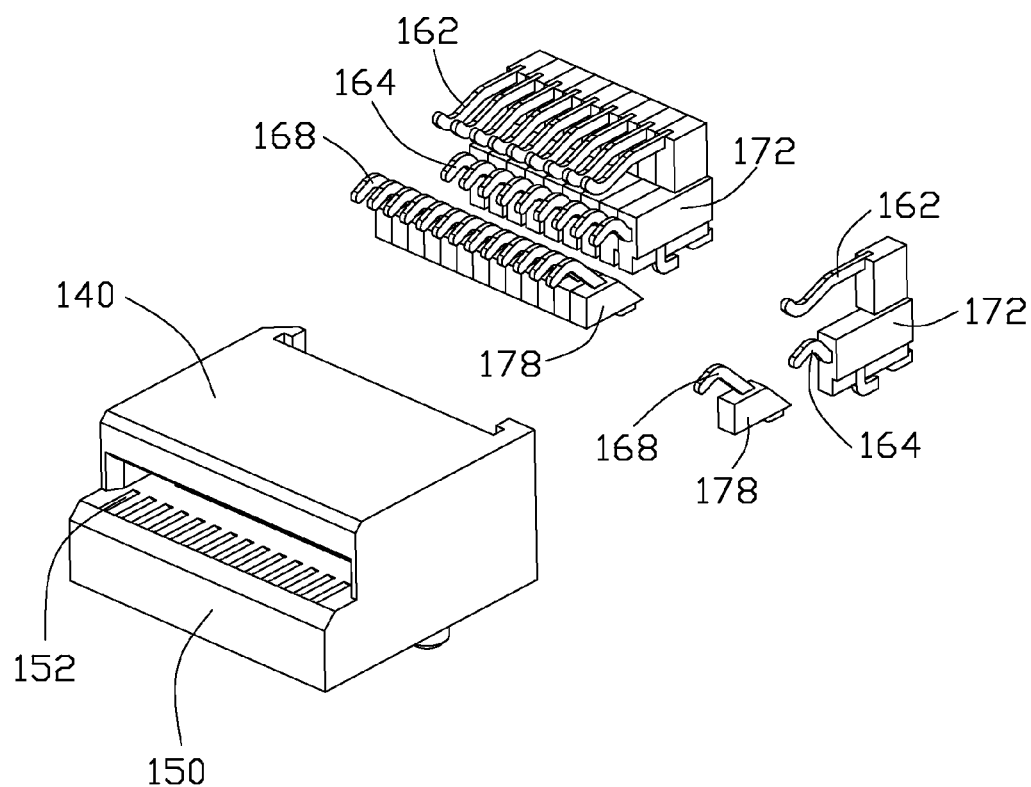
FIG. 7 is a exploded view of the electrical receptacle shown in FIG. 5.
Figure 8:
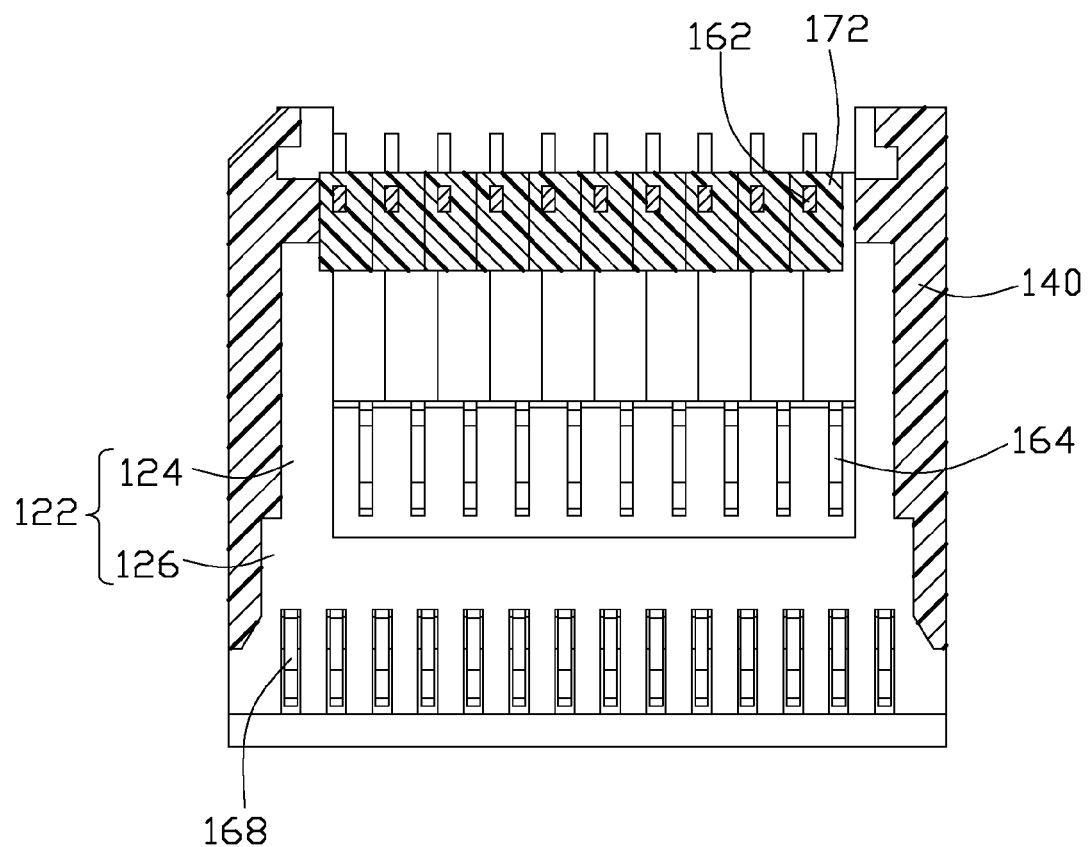
FIG. 8 is a cross section view taken along a line VIII-VIII shown in FIG. 5.
Figure 9:
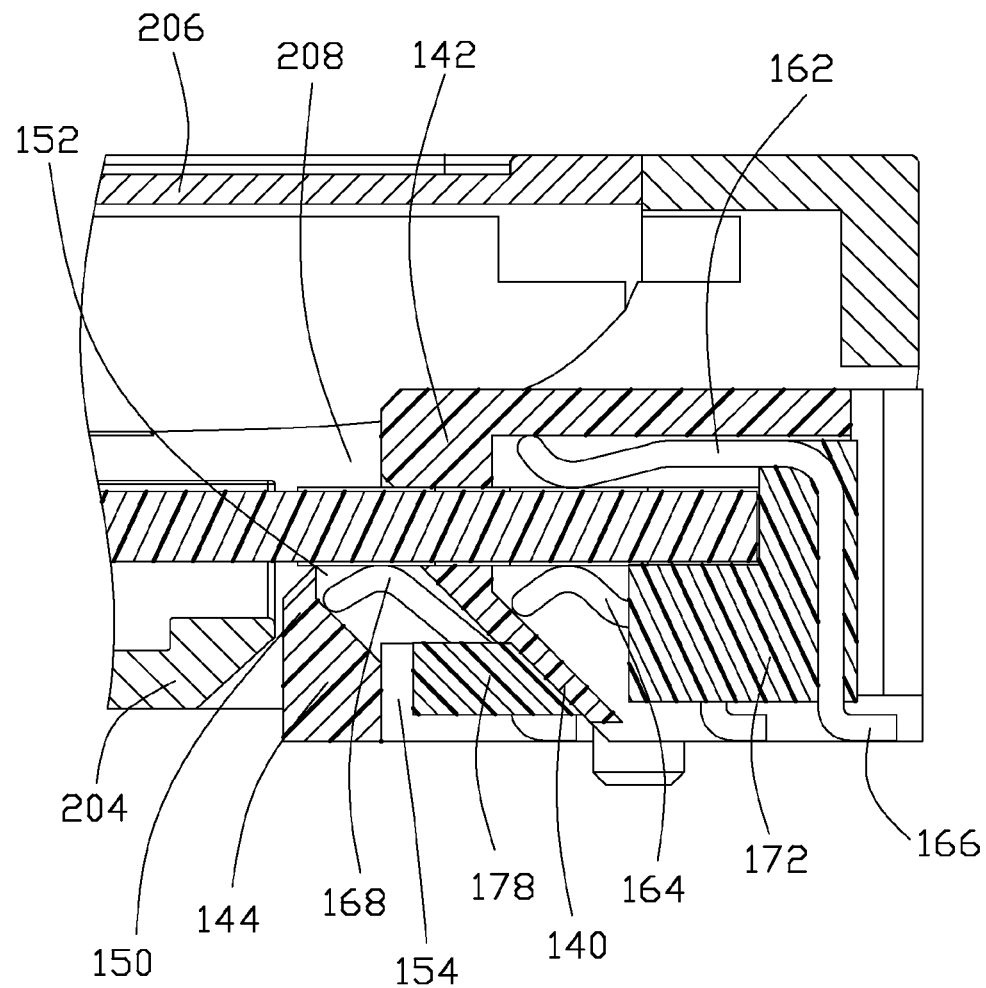
FIG. 9 is a cross section view taken along a line IX-IX shown in FIG. 5.

Referring to FIGS. 7-9, the insulating housing 140 defining a lower front cavity 154 and a rear cavity (not labelled), respectively receiving the first insulating materials 172 and the second insulating materials 178. The insulating housing 140 defines a number of passageways 152 communicating the front cavity 154 to the horizontal slot 122 and a connecting wall 150 in front of the passageways 152 (best shown in FIG. 9). The insulating materials 178 insert-molded with the third mating contacts 168 are separated from the insulating materials 172 insert-molded with the first and second mating contacts 162, 164.

It should be noted that all mating contacts above the horizontal slot 122 for contacting the contacting pads of the PCB 220 of electrical plug are lined in one line, while all mating contacts below the horizontal slot for contacting the mating pads of the PCB 220 are lined in two or more lines one behind another, which results that the electrical receptacle 120 could be designed with a greater signal density but a same high profile as the existing SFP receptacle.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. An electrical connector comprising:
   an insulating housing defining a horizontal slot for receiving a card edge, the horizontal slot extending along a lateral direction perpendicular to a front-to-rear direction;
   a row of first mating contacts arranged along an upper side of the horizontal slot;
   a row of second mating contacts arranged along a lower side of the horizontal slot;
   a row of third mating contacts arranged along the lower side of the horizontal slot and in front of the row of the second mating contacts;
   wherein the insulating housing forms a front step on the lower side relative to the upper side of the horizontal slot for receiving a part of the third mating contacts.

2. An electrical connector as claimed in claim 1, wherein each of the first mating contacts is offset in the lateral direction a distance relative to a corresponding second mating contact.

3. An electrical connector as claimed in claim 1, wherein each of the first mating contacts and a corresponding second mating contact are insert-molded into a first plastic and forms a first wafer.

4. An electrical connector as claimed in claim 1, wherein each of the third mating contacts is insert-molded into a second plastic and forms a second wafer.

5. An electrical connector as claimed in claim 1, wherein each of the first mating contacts, the second mating contacts and the third mating contacts has a soldering portion disposed on a common horizontal surface under the insulating housing.

6. An electrical connector as claimed in claim 1, wherein the insulative material comprises a bottom face mountable onto a host board.

7. An electrical plug comprising:
   a shielding shell defining a cavity therein; and
   a printed circuit board (PCB) defining a top face and a bottom face, the PCB being received in the cavity and having a front edge to be inserted into a receptacle, the front edge comprising a front narrower portion and a rear broader portion, the front narrower portion having a row of first mating pads on the top face and a row of second mating pads on the bottom face, the rear broader portion having a row of third mating pads on the bottom face.

8. An electrical plug as claimed in claim 7, wherein the number of the third mating pads is greater than the number of the second mating pads.

9. An electrical plug as claimed in claim 7, wherein the front narrower portion is compatible with an existing receptacle and the rear broader portion acts as a block preventing the electrical plug from being further inserted into the existing receptacle.

10. An electrical plug as claimed in claim 7, wherein the front narrower portion is compatible with a SFP receptacle and the rear broader portion acts as a block preventing the electrical plug from further insertion into the SFP receptacle.

11. An electrical plug as claimed in claim 7, wherein the PCB includes a primary PCB and a secondary PCB attached to a bottom side of the primary PCB, the first and the second mating pads being disposed on opposite sides of the primary PCB and the third mating pads being disposed on a bottom side of the secondary PCB.

12. An electrical plug as claimed in claim 11, wherein the rear broader portion has no pad on the top face for mating with a receptacle.

13. An electrical plug as claimed in claim 12, wherein the shielding shell includes a top metal cover and a bottom metal cover combined together, the PCB being sandwiched between the top and the bottom metal covers.

14. An electrical receptacle defining a bottom face to be mounted onto a horizontal host board and a horizontal slot opening forwardly to define a front-to-rear direction, a vertical direction, and a transverse direction, the electrical receptacle comprising:
   a transverse row of first mating contacts having contacting portions forwardly and downwardly protruding into said horizontal slot and terminating portions downwardly extending to be mounted to the host board, the contacting portions of the first mating contacts are disposed in a first transverse line;
   a transverse row of second mating contacts disposed below the horizontal slot and having contacting portions upwardly protruding into said horizontal slot and terminating portions downwardly extending to be mounted to the host board, the contacting portions of the second mating contacts are disposed in a second transverse line;
   a transverse row of third mating contacts disposed below the horizontal slot and having contacting portions upwardly protruding into said horizontal slot and terminating portions downwardly extending to be mounted to the host board, the contacting portions of the third mating contacts are disposed in a third transverse line before the second transverse line;
   an insulating housing having an upper wall and a lower wall defining the horizontal slot, the lower wall defining an lower cavity and a plurality of passageways communicating the lower cavity to the horizontal slot; and at least one plastic insert-molded with one or more of the third mating contacts, said at least one plastic being received in the lower cavity, each of the third mating contacts having a contacting portion extending through one of said passageways.

15. The electrical receptacle as claimed in claim 14, wherein the lower wall having a connection portion in front of the passageways.

16. The electrical receptacle as claimed in claim 15, wherein the lower cavity opens downwardly so that said at least one plastic could be upwardly mounted into the lower cavity.

17. The electrical receptacle as claimed in claim 16, comprising a plurality of other plastics insert-molded with the first and second mating contacts, wherein said at least one plastic insert-molded with the third mating contact is separated from said other plastics insert-molded with the first and second mating contacts.

18. The electrical receptacle as claimed in claim 14, wherein the contacting portions of the first and the second mating contacts are compatible to an existed SFP+ plug.

19. The electrical receptacle as claimed in claim 18, wherein the transverse row of third mating contacts are arranged alternatively in pairs adapted for differential signals and singles adapted for grounding, and there are five pairs of third mating contacts and four singles of third mating contacts.

20. The electrical receptacle as claimed in claim 19, wherein there is no mating contact disposed on an upper side of the horizontal slot before the first mating contacts.

* * * * *